(12) United States Patent
Dieny et al.

(10) Patent No.: US 8,542,072 B2
(45) Date of Patent: Sep. 24, 2013

(54) SPIN-VALVE OR TUNNEL-JUNCTION RADIO-FREQUENCY OSCILLATOR, PROCESS FOR ADJUSTING THE FREQUENCY OF SUCH AN OSCILLATOR AND NETWORK CONSISTING OF A PLURALITY OF SUCH OSCILLATORS

(75) Inventors: Bernard Dieny, Lans En Vercos (FR); Marie-Claire Cyrille, Sinard (FR); Ursula Ebels, Grenoble (FR); Liliana Prejbeanu, Sassenage (FR)

(73) Assignee: Commissariat a l'Energie Automique et aux Energies Alternatives (FR)

( * ) Notice: Subject to any disclaimer, the term of this patent is extended or adjusted under 35 U.S.C. 154(b) by 75 days.

(21) Appl. No.: 13/245,540

(22) Filed: Sep. 26, 2011

(65) Prior Publication Data
US 2012/0075031 A1 Mar. 29, 2012

Related U.S. Application Data

(63) Continuation of application No. PCT/FR2010/050685, filed on Apr. 9, 2010.

(30) Foreign Application Priority Data

Apr. 9, 2009 (FR) ...................................... 09 52319

(51) Int. Cl.
*H03B 28/00* (2006.01)
(52) U.S. Cl.
USPC ..... 331/94.1; 331/107 R; 331/187; 360/324.1
(58) Field of Classification Search
CPC ................................ B82Y 25/00; H03B 28/00

USPC ..... 331/94.1, 3, 107 R, 157, 187; 360/324.1, 360/324.11, 324.12; 365/158
See application file for complete search history.

(56) References Cited

U.S. PATENT DOCUMENTS

| 7,859,349 | B2 * | 12/2010 | Eyckmans et al. | 331/94.1 |
| 7,898,849 | B2 * | 3/2011 | Clinton et al. | 365/173 |
| 2008/0112094 | A1 * | 5/2008 | Kent et al. | 360/324.11 |

OTHER PUBLICATIONS

Kiselev, S. I., et al. "Microwave oscillations of a nanomagnet driven by a spin-polarized current." arXiv preprint cond-mat/0306259 (2003).*

* cited by examiner

*Primary Examiner* — Ryan Johnson
(74) *Attorney, Agent, or Firm* — St. Onge Steward Johnston & Reens LLC (57) ABSTRACT

A radio-frequency oscillator incorporates a magnetoresistive device within which an electron current is able to flow. The device includes a stack including: a magnetic trapped layer, the magnetization of which is of substantially fixed direction; a magnetic free layer; and a non-magnetic intermediate layer-interposed between the free layer and the trapped layer. The oscillator also includes a mechanism capable of making an electron current flow in the layers constituting the stack and in a direction perpendicular to the plane which contains the layers. At least the free layer is devoid of any material at its center. The electron current density flowing through the stack is capable of generating a magnetization in the free layer in a micromagnetic configuration in the shape of a skewed vortex flowing in the free layer around the center of the free layer.

18 Claims, 7 Drawing Sheets

PRIOR ART

SPIN-VALVE OR TUNNEL-JUNCTION RADIO-FREQUENCY OSCILLATOR, PROCESS FOR ADJUSTING THE FREQUENCY OF SUCH AN OSCILLATOR AND NETWORK CONSISTING OF A PLURALITY OF SUCH OSCILLATORS

CROSS-REFERENCE TO RELATED APPLICATIONS

The present application is a continuation of pending International Patent Application PCT/FR2010/050685 filed on Apr. 9, 2010 which designates the United States and claims priority from French Patent Application No. 0952319 filed on Apr. 9, 2009, the content of which is incorporated herein by reference

FIELD OF THE INVENTION

This invention takes its place in the field of radio-frequency oscillators that employ thin layer magnetic systems technology. It relates more specifically to radio-frequency oscillators of this kind that employ spin valves or magnetic tunnel junctions comprising a magnetic stack of at least one free magnetic layer, a trapped magnetic layer, said layers being interfaced by a non-magnetic intermediate layer.

BACKGROUND OF THE INVENTION

Radio-frequency oscillators are intended to operate in high frequency ranges, typically between a few tens of megahertz and a few tens of gigahertz.

To meet the demands arising from the development of nomad applications, and particularly mobile telephony (cell phones, mobiles), because of the saturation of the frequency bands assigned to telecommunications, a proposal has been made to replace the static allocation of said frequency bands with a dynamic allocation. This principle rests on the capacity to analyze the frequency spectrum, and identify free frequency bands, in order to be able to use them. This is then known as "opportunistic radio".

However, in order to apply this dynamic frequency allocation principle, the devices that use it must be provided with very wide band oscillators, and furthermore be highly effective in terms of phase noise, and therefore have a high quality coefficient $Q=f/\Delta f$.

One technical solution suitable for meeting these demands lies in using radio-frequency oscillators based on spintronics using the spin transfer phenomenon. With oscillators of this kind wide frequency accordability is provided in a frequency range running from a few hundred MHz to a few tens of GHz offering a high quality factor Q, and employing a relatively straightforward architecture.

Spintronics uses electron spin as an additional degree of freedom compared with conventional electronics which uses only the electron charge, in order to generate new effects.

It has thus been shown that a spin polarized current passed through a thin magnetic layer can induce a reversal of its magnetization in the absence of any external magnetic field. This phenomenon is known as spin transfer. In some geometries, the spin polarized current may also generate sustained magnetic excitations, also referred to as oscillations. The use of the effect of generating sustained magnetic excitations in a magnetoresistive device allows this effect to be converted into an electric resistance modulation that can be used directly in electronic circuits, and is therefore as a result able to intervene directly at frequency level.

Document U.S. Pat. No. 5,695,864 describes various developments that employ the aforementioned principle, and in particular describes the precession of the magnetization of a magnetic layer passed through by a spin polarized electric current. A stack of magnetic layers able to constitute such a radio-frequency oscillator has been shown in FIG. 1. This stack is inserted between two electrical contact zones 5, 5', made for example out of copper, aluminium or gold.

Figure 1:
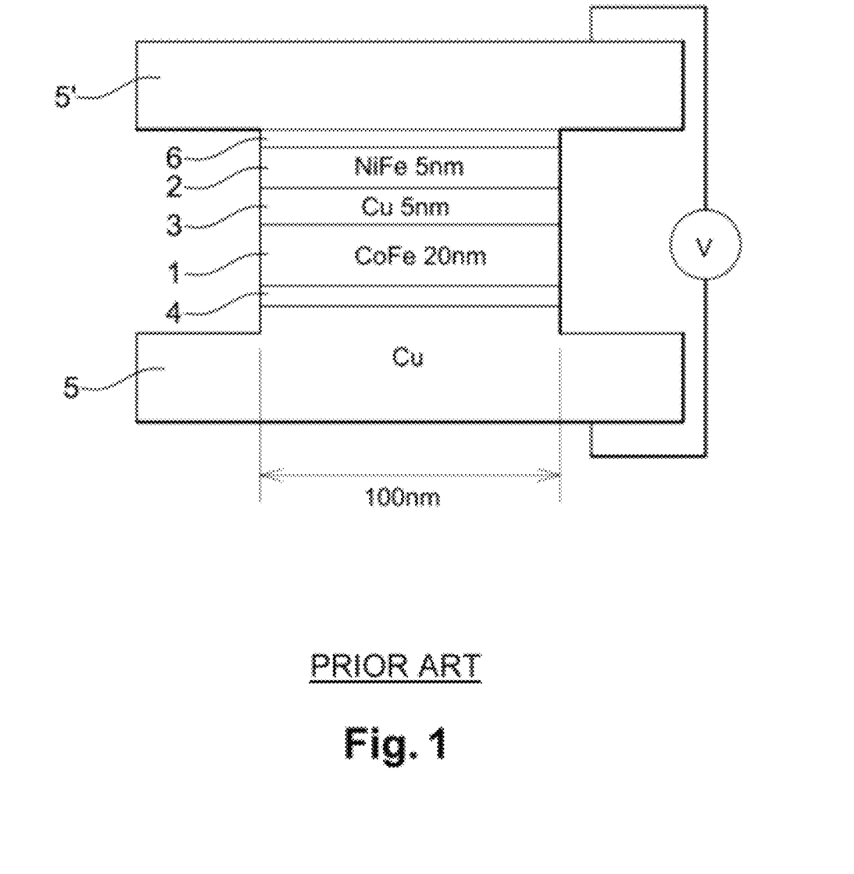
FIG. 1 is a diagrammatic representation of a prior art oscillator.

The layer 2 of this stack, known as the "trapped layer", is magnetized in a fixed direction. It may consist of a single layer, with a typical thickness of between 5 and 100 nanometers, made of cobalt for example or more generally of a cobalt- and/or iron- and/or nickel-based alloy (for example CoFe or NiFe). This trapped layer 2 may be single or synthetic anti-ferromagnetic, in other words consist of two ferromagnetic layers coupled anti-ferromagnetically through a spacer of appropriate composition and thickness, made for example of ruthenium with a thickness of between 0.6 nm and 0.9 nm. This trapped layer fulfils the function of polarizer. As such, the electric current electrons passing through the layers constituting the magnetoresistive device perpendicular to their plane, reflected or transmitted by the polarizer, are polarized with a direction of spin parallel to the magnetization that the layer 2 has at the interface opposite the one in contact with an anti-ferromagnetic layer 6, with which it is associated, and intended to fix the direction of its magnetization. This anti-ferromagnetic layer 6 may for example be made of IrMn or FeMn or PtMn or NiMn.

The trapped layer 2 receives on its face opposite the face receiving the anti-ferromagnetic layer 6 another non-magnetic layer 3 functioning as spacer. This layer 3 is metallic in nature, typically a layer of copper between 3 and 10 nanometers thick, or is constituted by a fine insulating layer of the aluminium oxide type, with a typical thickness of between 0.5 and 1.5 nanometers, or of magnesium oxide, with a typical thickness of between 0.5 and 3 nanometers. On the other side of the spacer 3 is put in place a layer 1 known as a "free layer", generally narrower than the layer 2. This layer may be single of composite, in other words formed by the association of a plurality of magnetic layers. It may also be coupled with an anti-ferromagnetic layer 4 added to it on its face opposite the interface of the layer 1 with the spacer 3. It must simply remain freer than the trapped layer. This layer 4 is constituted for example of an alloy such as $Ir_{80}Mn_{20}$, FeMn or PtMn. The material of the layer 1 is generally constituted of a cobalt- and/or iron- and/or nickel-based alloy.

A proposal has been made to produce the magnetoresistive stack of the system so described in the form of a cylinder, thus constituting a nanopillar, with the critical diameter thereof being between 50 and 200 nanometers. As such, with said configuration and under the sole action of a spin-polarized direct current passing through, in other words perpendicular to the stack of its magnetic layers, the magnetization of the free layer is made subject to sustained oscillations under certain conditions. The sustained magnetization oscillations appear more often than not when the effects of the effective magnetic field acting on the magnetization of the free layer and the effect of the spin polarized current passing through this layer are antagonistic. This is the case for example if a field is applied parallel to the magnetization of the trapped layer 2, promoting the parallel alignment of the magnetizations of the layers 1 and 2 and if the current flows from the trapped layer towards the free layer (the electrons going from the free layer towards the trapped layer) which promotes the anti-parallel alignment of the magnetizations.

This oscillation generates a very-high frequency alternating voltage via the magnetoresistive properties of these systems. Indeed, the resistance of an anti-parallel alignment is greater than for a parallel alignment of the magnetizations of the polarizing and free layers respectively.

The frequency of this voltage is accordable via the direct current density applied through the stack in a range of frequencies running from a gigahertz to a few tens of gigahertz with a quality factor that can reach very high values above 10.000.

If, on paper, such an architecture is expected to give good results, experience shows that when these oscillators are used in frequency syntheses a number of technological obstacles are encountered, the two main ones being the output power, in other words the amplitude of the wanted signal being too weak, and spectral line widths that are too large, hence a low quality factor $f/\Delta f$.

In relation to this latter point, it has been possible to show that significant line widths are generally inherent in a lack of coherence in the precession movement of the magnetization. This lack of coherence seems to have two distinct origins:

the low volume of the magnetoresistive stack which renders it more sensitive to the effects of thermal fluctuations in the magnetization as well as to the nanofabrication process (defects at the edge of the stack causing local trapping sites of the magnetization leading to instabilities in the precession movement of the magnetization);

the Oersted field effect or Amperian field (field created by the current flowing in the pillar and governed by the Biot-Savard Law) induced by the applied current which, in a full cylindrical structure, tends to induce a magnetization shear with a singularity at the centre.

The intended aim of this invention is to propose a radio-frequency oscillator that can overcome the problem related to the lack of coherence of the precession movement of the magnetization.

SUMMARY OF THE INVENTION

To this end, the invention proposes a radio-frequency oscillator that incorporates a magnetoresistive device within which an electron current is able to flow. Said magnetoresistive device comprises:

a first magnetic layer, known as a "trapped layer", the magnetization of which is of substantially fixed direction;

a second magnetic layer known as a "free layer";

a non-magnetic layer, known as an "intermediate layer", interposed between the first and second layer.

This device also comprises means capable of making an electron current flow in said layers constituting the aforementioned stack and in a direction perpendicular to the plane which contains said layers.

According to the invention, at least the free layer is devoid of any material at its centre and the electron current density flowing through the stack of said layers is capable of generating a magnetization in said layer in a micromagnetic configuration in the shape of a skewed vortex flowing in said free layer around the central zone devoid of material.

It is shown that with a free layer architecture of this kind, in appropriate conditions arising, on the one hand, from the dimensions of the free layer, and more specifically from the outer and inner dimensions of the sector it defines, and on the other hand from the electron current density flowing in the stack constituted by the magnetic layers and by the spacer, the magnetization of the free layer assumes a vortex type micromagnetic configuration, in other words the magnetization rotates along the sector constituting the free layer while remaining substantially tangent to the edge of said sector. The direction of rotation of the magnetization around the sector (clockwise or in the opposite direction) is known as chirality.

However, in the presence of a current flowing through the stack perpendicular to the interfaces, this vortex configuration may have two types of symmetry defect, particularly cylindrical if the free layer assumes the shape of a ring, flowing in said free layer around the central zone devoid of material generating the required radio-frequency oscillation: either a local change in vortex chirality, constituting a first embodiment of the invention, or a radial movement of the vortex core, constituting a second embodiment of the invention, as set out in detail below.

The dimensions of the free layer, and more specifically the outer and inner dimensions of the sector it defines, and the electron current density required to obtain these symmetry defects of the vortex may be evaluated using micro-magnetism simulators as commonly used in the field. As an indication, OOMMF software (available from the web address http://math.nist.gov/oommf/) may be used for example.

As such, according to a first embodiment of the invention, the vortex symmetry defect may arise from a local change of chirality of said vortex which is manifested through the creation of a magnetic domain between two walls defining the sector constituting the free layer. Under the effect of the spin polarized current flowing through the free layer, the local chirality defect limited by the two walls of the sector rotates over time around said sector, thereby possibly causing an oscillation of the electric resistance of the stack.

What is more, these oscillations can be observed even at zero applied field, in other words in the absence of external magnetic field.

According to the invention, the free layer may be in the form of a ring, in other words a hollow cylinder, defined by an inner wall and an outer wall.

In this configuration, the internal diameter of the ring is between 50 and 200 nanometers, and its external diameter is between 200 and 500 nanometers, typical magnitudes that are easily achievable technologically and which allow the expected performance to be obtained. Additionally, the oscillation frequency is adjustable via the geometry conferred on the ring.

However, an order n symmetry may be conferred on the free layer, n being a whole number higher than 1, and typically of order 4, particularly if one of the walls defining the sector is square in shape, or of order 6, one of the walls defining the sector then being hexagonal in shape, or even of a higher order. In these configurations, the rotation of the vortex symmetry defect no longer rotates evenly around the sector, unlike in the specific circumstance where the sector is annular in shape, but with jolts, and particularly with acceleration and deceleration phases related to the position of the dissymmetries of at least one of the walls of the sector, and particularly the angles. These jolts are able to generate harmonics in the oscillation signal that can be exploited to reach even higher frequencies than in the case of a sector of annular shape.

According to the invention, the trapped ferromagnetic layer functions as an analyzer and is single or synthetic antiferromagnetic, and is trapped by an anti-ferromagnetic layer positioned at its interface opposite the interface of the trapped layer with the spacer.

According to another feature of the invention, all the layers constituting the magnetoresistive stack are in the form of rings, said layers having substantially the same diameter; however, etching the pillar may lead to a slight widening of the foot of the structure.

According to one feature of the invention, a polarizer may be added, and positioned adjacent to the free layer, and separated therefrom by a spacer that is metallic or dielectric in nature.

The free layer may also be of the synthetic anti-ferromagnetic type.

According to a second feature of the invention, the vortex symmetry defect, needed, as already stated, to obtain the radio-frequency oscillation, arises from the radial movement of the vortex core. In this configuration, the sector constituting the free layer acts to confine said vortex.

The turning motion of the vortex core is the result on the one hand of the spin transfer torque of the electrons passing through the stack, and which tends to induce a centrifugal motion of the vortex core, and on the other hand, of the Amperian or electric field generated by said electron current, which tends to create a potential for attraction towards the centre of the sector.

In fact, the side confinement in the sector tends to compress the vortex towards the edge or outer wall of the sector, which accelerates the turning motion. As such, the precession frequency can be significantly increased, until it reaches in particular a plurality of gigahertz. In so doing, the smaller the outer dimension of the sector, and typically in the case of an annular sector, with a diameter of less than 200 nanometers, the more the precession frequency increases. This increase in the frequency is also conditioned with the applied electron current density.

It has also been shown that the precession frequency is also able to increase with GILBERT damping (see the publication by Q. MISTRAL et al—"*Current-driven vortex oscillations in metallic nanocontacts*"—Physical Review Letter—100, 257201 (2008)). So, and according to one advantageous version of the invention, the free magnetic layer is doped with rare earth impurities, such as Dy or Tb for example.

According to this embodiment, the trapped magnetization layer has a substantially single-domain planar magnetization. It consists for example of Co- and/or Fe- and/or Ni-based ferromagnetic alloys trapped by an anti-ferromagnetic layer of IrMn, PtMn or NiMn for example.

The alternatives described in relation to the first embodiment of the invention can also be applied to this second embodiment.

BRIEF DESCRIPTION OF THE DRAWINGS

The way in which the invention may be embodied and the resulting advantages will become clearer from the following embodiment examples, given by way of illustration and non-restrictively, supported by the appended figures, and wherein the same reference numbers are used to denote the same elements.

As already stated.

DETAILED DESCRIPTION OF THE INVENTION

Figure 2:
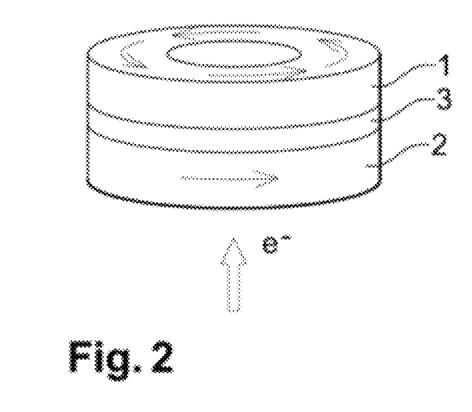
FIG. 2 is a diagrammatic representation of the magnetoresistive stack according to a first embodiment of the invention, with the free layer in the shape of a ring.
Figure 3:
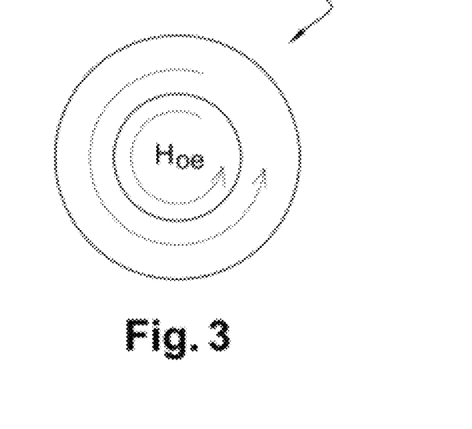
FIG. 3 is a view of the free layer, which aims to show the Oersted field in the ring constituting the free layer, and consequently, the absence of magnetization shear.

A first embodiment of the invention has been shown in FIGS. 2 and 3, in the case in point the most basic. It shows only the single stack of the magnetic layers and the spacer, it being understood, as in the following figures, that this stack is intended to receive, as shown in FIG. 1, electrical contact zones for an electron current to be made to flow in said stack and in a direction perpendicular to the plane of the layers it contains.

According to a first alternative to this embodiment of the invention, said stack is in the form of a nanopillar that is substantially cylindrical in shape.

It includes an oscillating free layer 1 that comes in an annular shape. Put another way, this layer 1 consists of a hollow cylinder, which is therefore devoid of material at its centre, the dimensional characteristics of which are as follows:
internal diameter of between 50 and 200 nanometers;
external diameter of between 200 and 500 nanometers.

This free layer 1 has a typical thickness of between 1 and 6 nanometers. It is produced based on cobalt, iron or nickel alloys, such as for example CoFe, CoFeB, NiFe, etc.

This free layer 1 is separated from a trapped layer 2 by a non-magnetic spacer 3. In this embodiment, the trapped layer and the spacer may each be constituted by a full cylinder or a hollow cylinder like the free layer 1.

The spacer 3 may be metallic in nature, and typically made of copper, in the case of a spin valve. Conversely it is constituted by a dielectric material, such as $Al_2O_3$, MgO, $SrTiO_3$, $HfO_2$, $Ta_2O_5$ in the case of a magnetic tunnel junction. It is typically between 1 and 2 nanometers thick.

The trapped layer 2 may be a single or synthetic anti-ferromagnetic layer. Its magnetization is fixed. In the example in FIG. 2, this trapped layer 2 may, as already previously indicated, either be constituted by a full cylinder, or be constituted by a hollow cylinder like the free layer 1. It may be constituted by a layer that typically is between 6 and 20 nanometers thick, or again be coupled with a layer made of an anti-ferromagnetic material, made for example of a manganese-based alloy.

The trapped layer 2 acts as a polarizer for the spin of the conduction electrons and in this case, the electrons passing through this layer are spin polarized and will then destabilize and induce the precession of the magnetization of the free layer 1.

The effect of implementing the free layer in annular shape has been shown in FIG. 3. The creation of an Oersted field can thus be seen due to the current passing through the structure being always of the same sign over a portion of the crown, with the result that the magnetization shear effect that is seen in full cylindrical structures disappears, thereby helping to optimize the coherence of the rotation of the magnetization of said free layer 1.

Additionally, because of this configuration of the free layer as a ring, a natural shutting-off of the magnetic flux may be observed, making it possible to render the internal field more homogenous along the ring: in so doing, the precession movement of the magnetization is more homogenous and the edge effects seen with prior art devices are greatly diminished.

Additionally, because of this configuration as a ring, it becomes possible to increase the volume of the magnetic layers constituting the stack. Furthermore, the magnetic field internal to the free layer is more homogenous. In so doing, a better coherence of magnetization dynamics is achieved, and in particular a smaller influence of thermal fluctuations on magnetization dynamics (as described in the article "*Stochastic theory of spin-transfer oscillator linewidths*", Joo-Von Kim; Phys. Rev. B 73, 174412 (2006)), and a minimization of the edge effects related to the nanofabrication of said stack.

Figure 4:
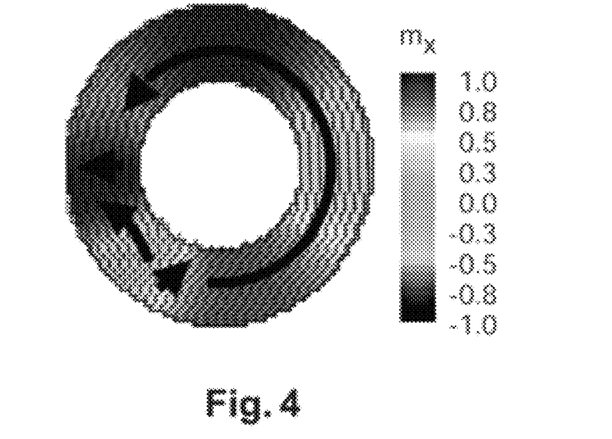
FIG. 4 is a diagrammatic representation of the free layer, which aims to show the skewness of the vortex generated in the ring defining said free layer.

FIG. 4 further shows the materialization of the effect generated in the free layer 1. In particular the chirality of the generated vortex may be seen, and more specifically, the creation of a magnetic domain between two magnetic walls, and which rotates around the ring. The presence of this domain generates a defect in the revolution symmetry of the vortex configuration. This defect here consists of a local inversion of the vortex chirality.

Figure 7:
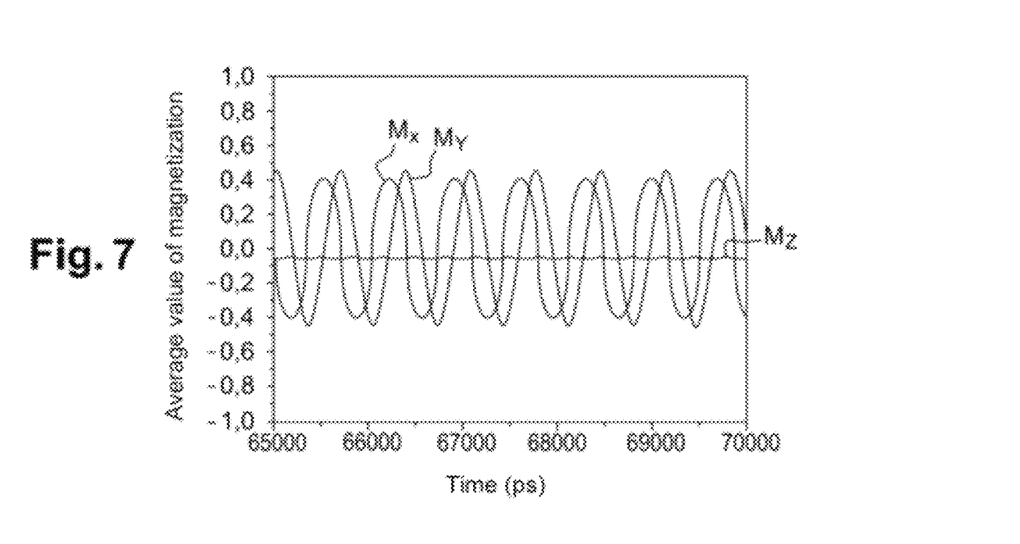
FIG. 7 is a graph showing the variation in the three components of the magnetization of the free layer as a function of time in the case of an annular shaped free layer.

The variation of the three components (ox, oy and oz) of the magnetization in the free layer 1 as a function of time has been shown in FIG. 7. The oscillations generated may thus be observed in the following conditions:

- polarizer with magnetization perpendicular to the plane of the layers produced based on a Pt/(Co0.4 nm/Pt0.5 nm)x multi-layer
- spacer separating this polarizer from the free layer made of copper;
- free layer 3.5 nm thick with magnetization in the plane of the layers, of moment $\mu Ms=1.1128$ T and Gilbert damping $\alpha=0.02$, presented in annular form, the external diameter of which is 200 nm and the internal diameter 100 nm;
- spacer separating the free layer from the trapped layer, made of copper or dielectric (aluminium or magnesium oxide)
- trapped layer functioning as an analyzer with its magnetization in the plane of the layers, trapped by an anti-ferromagnetic layer.

An oscillation is thus noted at 1.45 GHz obtained for an electron current density passing through the stack of $15.10^{10}$ A/m$^2$.

It has been seen that for the parameters selected, said oscillations were obtained over an electron current range of between $10.10^{10}$ and $20.10^{10}$ A/m$^2$.

Figure 8:
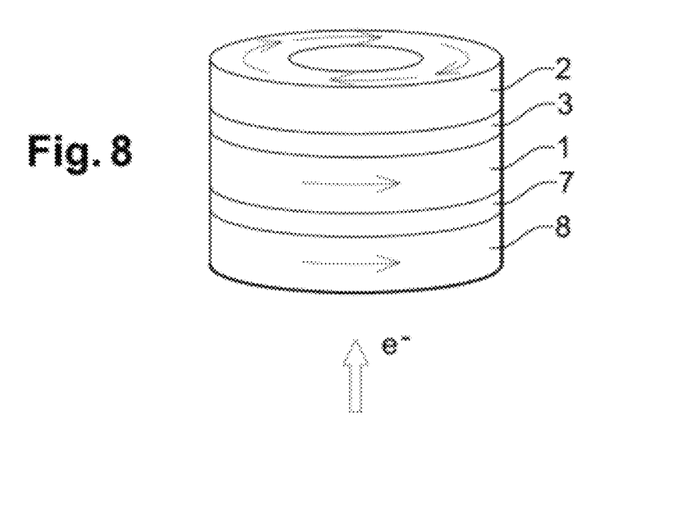
FIGS. 8 and 9 are diagrammatic representations of the magnetoresistive stack according to an alternative to the embodiment of the invention in FIGS. 2 and 3, with a single and synthetic anti-ferromagnetic free layer respectively.
Figure 9:
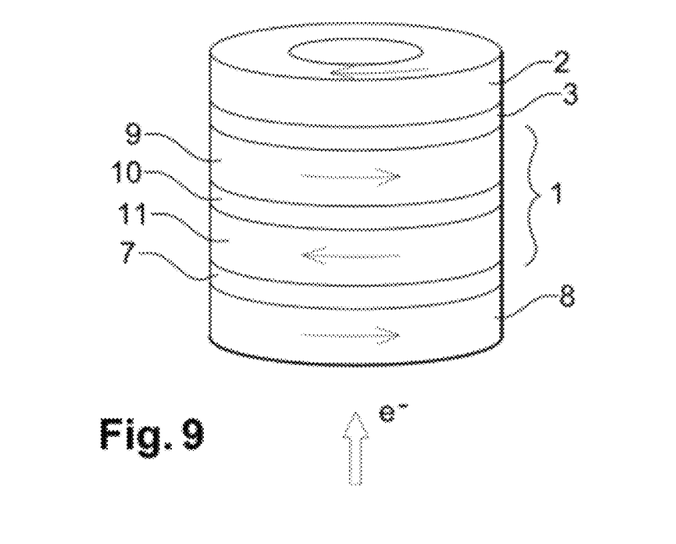

According to one alternative shown in FIGS. 8 and 9, to the stack is added a polarizer 8 decoupled from the free layer 1 by a non-magnetic spacer 7, of the metallic (of copper for example) or insulating or partially insulating type and to advantage of less resistance than the spacer 3 separating the layers 1 and 2. In this way, the dominant magnetoresistive effect producing the dynamic voltage variations between the top and the base of the stack comes from the sandwich formed by the layers 1, 2 and 3. The material depends on the type of polarizer: planar or perpendicular.

In the embodiment described in relation to FIGS. 8 and 9, this polarizer 8 has its planar magnetization. The material constituting this planar polarizer may be Co, CoFe, CoFeB, or again NiCoFe alloys, the magnetization of the planar polarizer being able to be trapped by an anti-ferromagnetic layer of PtMn, IrMn, NiMn, FeMn.

FIG. 8 shows the implementation of a single free layer while FIG. 9 shows the implementation of a free layer of the synthetic anti-ferromagnetic type, comprising two ferromagnetic layers 9 and 11 coupled in an antiparallel way one to another through a fine layer of non-magnetic material 10, made for example of ruthenium and of thickness between 0.5 and 0.9 nanometers.

In this configuration, the ferromagnetic layers 9 and 11 are made for example of a cobalt-based alloy.

Figure 10:
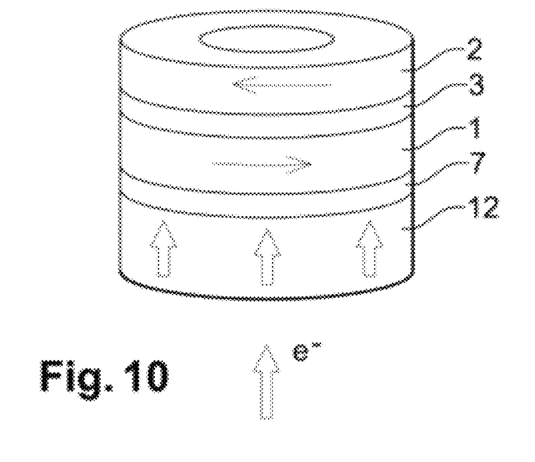
FIGS. 10 and 11 are diagrammatic representations of the magnetoresistive stack according to other alternatives to the embodiment of the invention shown in FIGS. 2 and 3, with a single and synthetic anti-ferromagnetic free layer respectively.
Figure 11:
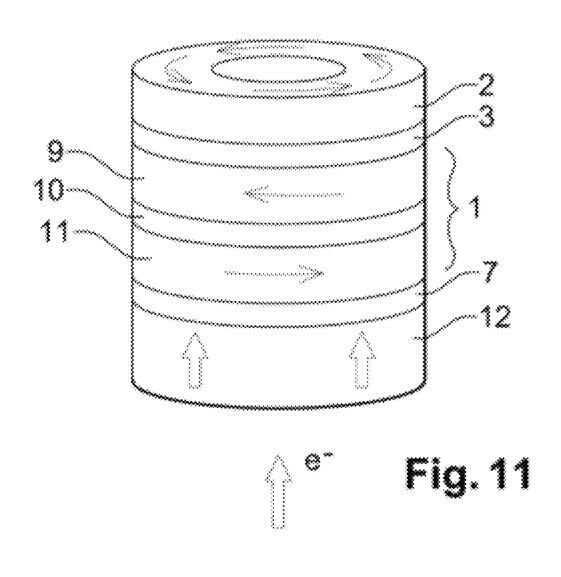

In another alternative of the invention shown in FIGS. 10 and 11, a polarizer 12 is also used, but the magnetization thereof is this time perpendicular relative to the plane of the layers, which may allow oscillations to be generated at zero applied field. This polarizer may be constituted by a CoPt, FePt alloy, rare earths/transition metals (TbCo, TbFe) or multi-layers of the Co/Pt, Co/Ni or Co/Pd type.

Figure 5:
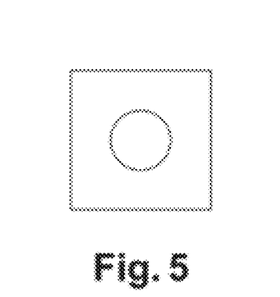
FIGS. 5, 5' and 5" are representations of the free layer according to alternatives to FIGS. 2 and 3, showing an order 4 symmetry.

FIG. 10 shows the case where the free layer is a single layer and FIG. 11 where the free layer is a synthetic anti-ferromagnetic layer, constituted by two ferromagnetic layers 9 and 11 separated by a metallic spacer 10, as has been described in relation to FIG. 5.

It is also conceivable to employ a polarizer in a continuous layer, in other words one that is not annular in nature, but constituted by a full cylinder. As such, by passing a sufficiently intense current during the anneal performed after the deposition of the magnetic layers constituting the stack, said anneal being necessary to direct the magnetization of the anti-ferromagnetic layer and therefore, by coupling, to trap the trapped layer, the Oersted field can be used to trap the continuous layer constituting the polarizer in a vortex state, which is tantamount to recreating the configuration specified in FIG. 2. The same effect may be obtained by employing a very thick trapped layer, typically 50 nanometers thick.

Figure 13:
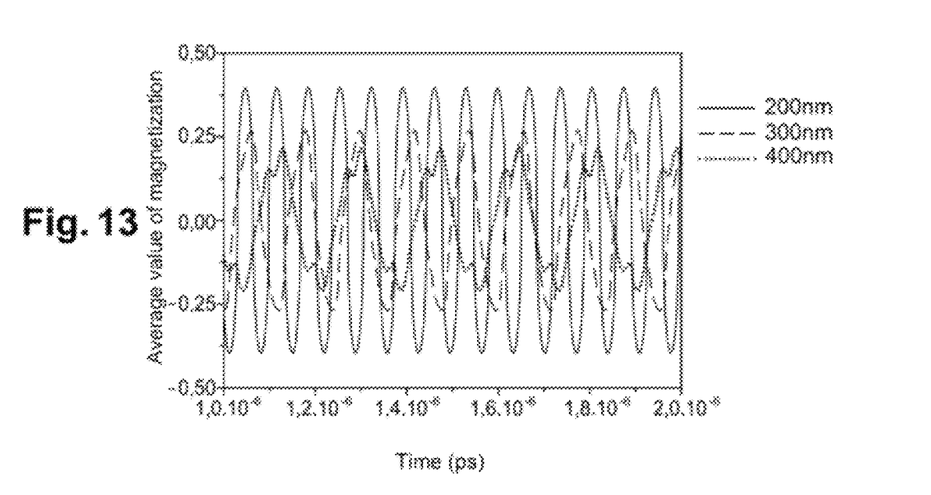
FIG. 13 is a graph showing the variation in a planar component of the magnetization as a function of time for various external diameters of the ring of the free layer.

The oscillation frequency can be adjusted through the geometry of the ring, and in particular by the respective values of its external diameter and its internal diameter. This is shown in FIG. 13 which shows the variation in a planar component of the magnetization as a function of the external diameter of the ring for the same parameters as those used for FIG. 7.

Figure 14:
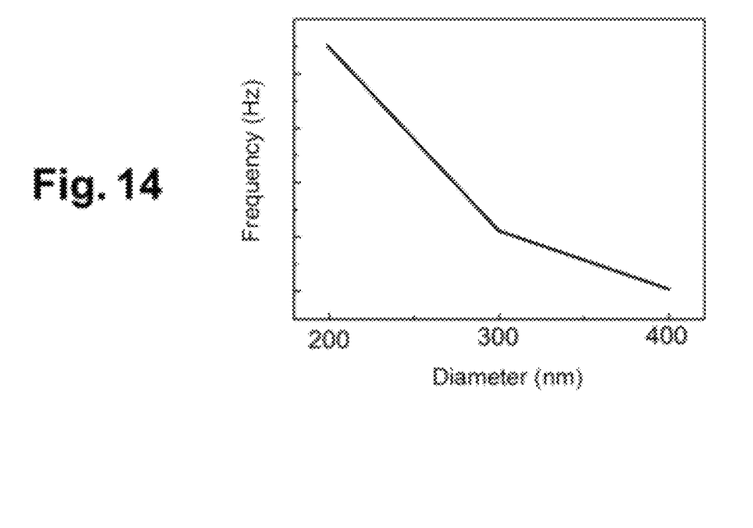
FIG. 14 is a graph showing the variation in the oscillation frequency as a function of the external diameter of said ring.

As such, at a distance separating the two diameters that is constant, the frequency diminishes when the external (and therefore internal) diameter increases. This is what can be seen for example in FIGS. 13 and 14.

Generally speaking, the frequency can be adjusted by modulating the distance separating the centre of the free layer from the outer wall that defines it.

It therefore becomes possible to produce a plurality of oscillators oscillating at different frequencies, arranged side by side on the same substrate, just by varying their geometry, and particularly the aforementioned distance, or, in the case of a free layer of annular shape, the external diameter of said layer.

A network of radio-frequency oscillators is thus obtained, the frequency of which is centred on a set and different value from one oscillator to another that can be addressed by appropriate peripheral electronics according to the frequency required. For each oscillator, the required frequency can be varied in a restricted range merely by varying the polarization current and/or by applying an external magnetic field.

Figure 6:
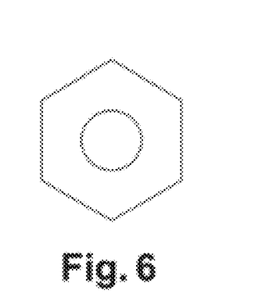
FIGS. 6 and 6' are diagrammatic representations of the free layer according to an alternative to FIGS. 2 and 3, showing an order 6 and higher order symmetry respectively.

Other alternatives to this first embodiment of the invention have been shown in FIGS. 5 and 6. In FIG. 5, the free layer 1 is no longer constituted by a regular ring, in other words one defined by two concentric circular walls, but:
- by a square-shaped outer wall and a circular inner wall (FIG. 5);
- by two square-shaped inner and outer walls respectively (FIG. 5');
- by a circular outer wall and a square-shaped inner wall (FIG. 5").

FIG. 6 shows a free layer defined by a hexagonal-shaped outer wall, and by a circular inner wall.

FIG. 6' shows a free layer, the outer wall of which is plurilobed, and the inner wall circular.

When the free layer is in the shape of a regular ring, as shown for example in FIGS. 2 and 3, the skewness of the vortex rotates evenly around the centre of the ring, generating an oscillation of frequency $f_0$ corresponding to the frequency of rotation of the different chirality zone of said vortex.

In the case of the configurations shown in FIG. 5, in FIG. 6 and in FIG. 6', wherein the symmetry of the free layer is of order 4 and order 6 respectively, the rotation of the vortex symmetry defect is modified, in so far as it no longer rotates evenly, as in the case of the ring in FIGS. 2 and 3, but with acceleration and deceleration phases related to the dissymmetries generated either by the outer wall, or by the inner wall. These successive phases generate harmonics in the oscillations signal of respective frequency $4.f_0$ and $6.f_0$ (or even $n.f_0$ if symmetry of order n), able to be exploited in order to reach even higher frequencies.

One embodiment of the magnetoresistive stack constituting the first embodiment of the invention is described in relation to FIGS. 12a to 12e.

Figure 12A:
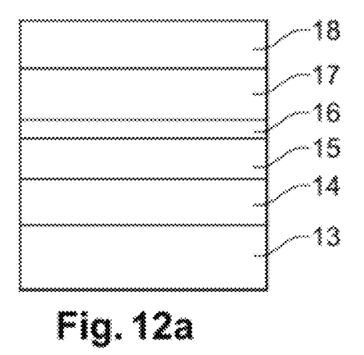
FIGS. 12a to 12e show diagrammatically the method for producing a magnetoresistive stack in accordance with the invention.
Figure 12B:
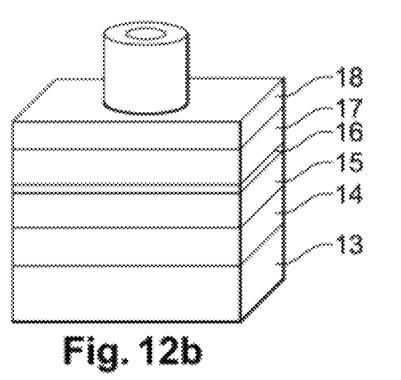

Once the magnetic stack, in the case in point constituted by an anti-ferromagnetic layer of the PtMn or IrMn 14 type, a ferromagnetic layer 15 constituted by a cobalt-based alloy, a tunnel barrier 16 constituted by an oxide of the AlOx, $SrTiO_3$, or MgO type, and lastly a ferromagnetic layer 17, also made for example based on cobalt, has been deposited (by cathode sputtering for example) on the lower electrode 13, made of copper or gold for example, a layer 18 is deposited made for example of tantalum, constituting a hard mask, intended to act against the etching activity subsequently implemented and therefore to temporarily protect the magnetic stack during said etching step (FIG. 12a).

A resin is then deposited onto this stack over the hard mask (FIG. 12b) in a zone corresponding to the dimension required for the nanocontact it is intended to produce. To this end, the resin is deposited full plate and then insulated by UV treatment through a chromium mask, or insulated by an ion beam in an "e-beam" masker, in order to define the hollow cylinder shape it is required to give to the deposited stack.

Figure 12C:
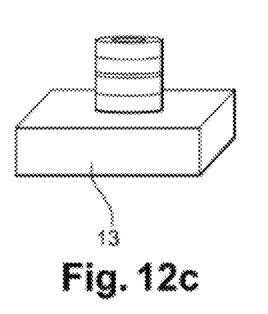

The assembly is then subjected to etching suitable for removing the hard mask and the various layers constituting the stack as far as the lower electrode, except over the parts protected by the crown of resin and the hard mask, in order to define the dimension and in particular the internal and external diameters of the contact point (FIG. 12c). This etching may be performed for example by Ion Beam Etching (IBE) or by Reactive Ion Etching (RIE).

Figure 12D:
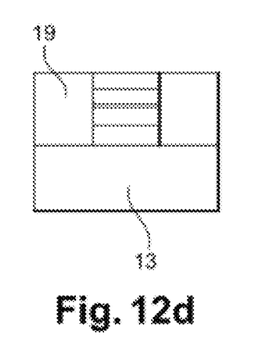

The assembly resulting from this last step is then encapsulated, said encapsulation being carried out by means of a dielectric material 19 of the silica or alumina type. This encapsulation is deposited by Physical Vapour Deposition (PVD) (FIG. 12d).

Figure 12E:
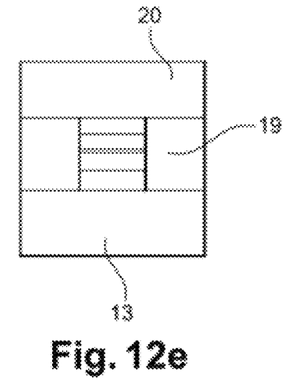

The next step is then planarization, for example by Chemical Mechanical Polishing (CMP), until on the upper level of the nanocontact a plane surface is obtained capable of receiving the upper electrode 20.

The metal material intended to constitute the upper electrode is then deposited and the next step is lithography and etching to define the shape of the upper electrode, and lastly the resin is withdrawn, by chemical means for example, to produce the oscillator.

Figure 15:
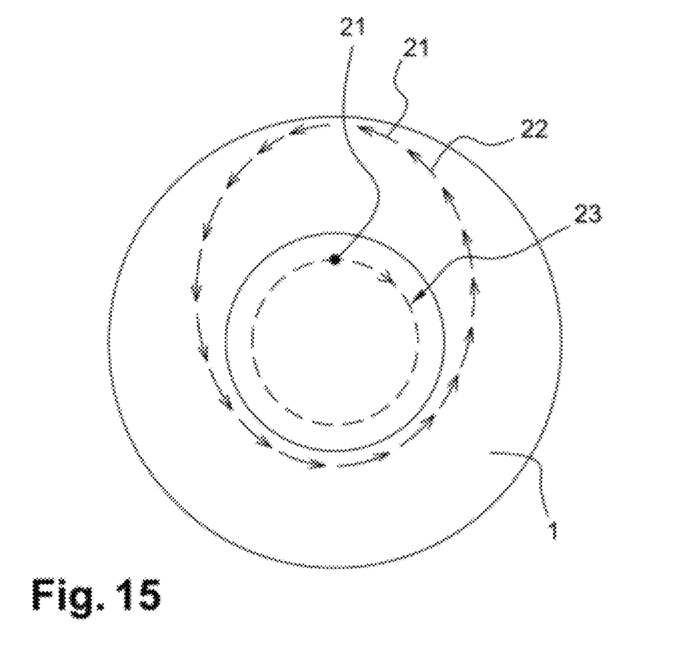
FIG. 15 is a diagrammatic representation of the inventive operation according to its second embodiment.

The inventive operating principle has been shown in FIG. 15 according to the second embodiment.

The radial movement of the vortex core 21, constituting the required symmetry suitable for generating oscillations has been shown in particular. As can be seen, the core 21 of the vortex 22 does not coincide with the centre of the ring constituting the free layer, but follows a concentric orbit 23 relative to said centre.

Consequently, the vortex is confined by the ring, as shown by the off-centre plotting 24 of said vortex.

In this embodiment, it is the gyration of the core of the vortex around the centre of the ring which generates the required oscillation. By modifying the geometry of the ring, and in particular by playing on the internal and external diameters thereof respectively, and additionally by playing on the electron current density flowing through the stack perpendicular to the plane of the layers constituting it, the rate of gyration of the vortex core can be modulated, and consequently the frequency of the oscillations.

As for the first embodiment, it is possible to give the free magnetic layer order n symmetry forms as shown in FIGS. 5, 5', 5", 6, 6' in order to generate basic frequency harmonics of order n.

It can thus be imagined how easy it is to produce such an oscillator, which has improved properties in terms of frequency and accordability synthesis, particularly given the greatest coherence of rotation of the magnetization of the free layer.

What is claimed is:

1. A radio-frequency oscillator incorporating a magnetoresistive device within which an electron current is able to flow, said device comprising a stack of layers comprising:
    a magnetic trapped layer, a magnetization of which is of substantially fixed direction;
    a magnetic free layer; and
    a non-magnetic intermediate layer interposed between the free layer and the trapped layer;
    the oscillator also comprising means capable of making an electron current flow in said layers constituting said stack and in a direction perpendicular to a plane which contains said layers,
    wherein at least the free layer is devoid of any material at a center thereof; and,
    wherein the means capable of making an electron current flow generates a current flowing through the stack of said layers having a density capable of generating a magnetization in said free layer in a micromagnetic configuration in the shape of a skewed vortex flowing in said free layer around the center of said free layer.

2. The radio-frequency oscillator as claimed in claim 1, wherein the free layer is in the shape of a ring defined by an inner wall and an outer wall.

3. The radio-frequency oscillator as claimed in claim 2, wherein an internal diameter of the ring is between 50 and 200 nanometers, and wherein an external diameter of the ring is between 200 and 500 nanometers.

4. The radio-frequency oscillator as claimed in claim 1, wherein all the layers comprising the stack are in the form of a ring.

5. The radio-frequency oscillator as claimed in claim 1, wherein the free layer has an order n symmetry shape, n being a whole number higher than 1, resulting from a profile of at least one of an outer wall defining the free layer and an inner wall defining the free layer.

6. The radio-frequency oscillator as claimed in claim 1, wherein the trapped layer is ferromagnetic, and additionally functions as an analyzer for the electron current able to pass through the trapped layer.

7. The radio-frequency oscillator as claimed in claim 6, wherein the trapped layer is single, wherein the trapped layer is made of at least one of a cobalt-based alloy, an iron-based alloy and a nickel-based alloy, and wherein the trapped layer is trapped by an anti-ferromagnetic layer positioned at an interface of the trapped layer opposite an interface of the trapped layer with the intermediate layer.

8. The radio-frequency oscillator as claimed in claim 6, wherein the trapped layer comprises a synthetic anti-ferromagnetic material.

9. The radio-frequency oscillator as claimed in claim 1, wherein the stack comprises a polarizer, decoupled from the free layer by a spacer made of a metallic or dielectric material.

10. The radio-frequency oscillator as claimed in claim 9, wherein the polarizer is constituted by a layer made of a cobalt or platinum or palladium alloy, a magnetization of which is directed perpendicular to the plane of the layers.

11. The radio-frequency oscillator as claimed in claim 1, wherein the intermediate layer is metallic in nature or is constituted by a tunnel barrier.

12. The radio-frequency oscillator as claimed in claim 1, wherein the free layer is doped with impurities selected from the Rare Earths.

13. A process for adjusting the frequency of a radio-frequency oscillator produced in accordance with claim 1, comprising providing different free layers, each having a different distance separating a center of the free layer from an outer wall defining the free layer.

14. The process for adjusting the frequency of a radio-frequency oscillator as claimed in claim 13, wherein the process further comprises modulating the electron current density flowing though the stack.

15. The process for adjusting the frequency of a radio-frequency oscillator as claimed in claim 14, wherein the current density is between $10.10^{10}$ and $20.10^{10}$ A/m$^2$.

16. A network of radio-frequency oscillators comprising on one and the same substrate a set of radio-frequency oscillators as claimed in claim 1, wherein a distance separating a center of the free layer from an outer wall defining the free layer varies from one oscillator to another, in order to confer on said oscillators a different oscillation frequency.

17. The radio-frequency oscillator as claimed in claim 7, wherein the trapped layer is made of a material comprising cobalt.

18. The radio-frequency oscillator as claimed in claim 9, wherein the polarizer is constituted by an alternation of Co/Pt or Co/Pd or Co/Ni multi-layers, a magnetization of which is directed perpendicular to the plane of the layers.

* * * * *